(12) United States Patent
Gray et al.

(10) Patent No.: US 7,282,732 B2
(45) Date of Patent: Oct. 16, 2007

(54) QUANTUM DOT STRUCTURES

(75) Inventors: Allen L Gray, Albuquerque, NM (US); Andreas Stintz, Albuquerque, NM (US); Kevin J Malloy, Albuquerque, NM (US); Luke F Lester, Albuquerque, NM (US); Petros M Varangis, Albuquerque, NM (US)

(73) Assignees: STC. unm, Albuquerque, NM (US); Innolume Acquisition, Inc., Santa Clara, CA (US)

( * ) Notice: Subject to any disclaimer, the term of this patent is extended or adjusted under 35 U.S.C. 154(b) by 0 days.

(21) Appl. No.: 10/971,555

(22) Filed: Oct. 21, 2004

(65) Prior Publication Data

US 2005/0199870 A1    Sep. 15, 2005

Related U.S. Application Data

(60) Provisional application No. 60/514,211, filed on Oct. 24, 2003.

(51) Int. Cl.
H01L 29/06    (2006.01)

(52) U.S. Cl. .................. 257/14; 257/17; 257/628; 372/45.01

(58) Field of Classification Search ............ 257/14, 257/17, 21, 627, 628; 372/45.01
See application file for complete search history.

(56) References Cited

U.S. PATENT DOCUMENTS

| 5,541,949 | A  | 7/1996  | Bhat et al. |
| 5,543,354 | A  | 8/1996  | Richard et al. |
| 5,557,627 | A  | 9/1996  | Schneider et al. |
| 5,608,229 | A  | 3/1997  | Mukai et al. |
| 5,614,435 | A  | 3/1997  | Petroff et al. |
| 5,710,436 | A  | 1/1998  | Tanamoto et al. |
| 5,714,765 | A  | 2/1998  | Noetzel et al. |
| 5,726,462 | A  | 3/1998  | Spahn et al. |
| 5,781,575 | A  | 7/1998  | Nilsson |
| 5,817,538 | A  | 10/1998 | Mukai et al. |
| 5,881,086 | A  | 3/1999  | Miyazawa et al. |
| 5,930,278 | A  | 7/1999  | Menigaux |
| 5,953,356 | A  | 9/1999  | Botez et al. |
| 6,052,400 | A  | 4/2000  | Nanbu et al. |
| 6,117,699 | A  | 9/2000  | Lemoff et al. |
| 6,177,684 | B1 | 1/2001  | Sugiyama |
| 6,285,704 | B1 | 9/2001  | Kullander-Sjoberg et al. |
| 6,329,668 | B1 | 12/2001 | Razeghi |
| 6,366,597 | B1 | 4/2002  | Yuen et al. |
| 6,369,403 | B1 | 4/2002  | Holonyak, Jr. |
| 6,489,175 | B1 | 12/2002 | Jiang et al. |
| 6,583,436 | B2 | 6/2003  | Petroff et al. |
| 6,600,169 | B2 | 7/2003  | Stintz et al. |
| 6,642,070 | B2 | 11/2003 | Jiang et al. |

(Continued)

OTHER PUBLICATIONS

PCT International Search Report and Written Opinion, PCT/US04/35293, Oct. 12, 2006, 8 pages.

(Continued)

*Primary Examiner*—Sara Crane
(74) *Attorney, Agent, or Firm*—Brown & Michaels, PC (57) ABSTRACT

Symmetric quantum dots are embedded in quantum wells. The symmetry is achieved by using slightly off-axis substrates and/or overpressure during the quantum dot growth. The quantum dot structure can be used in a variety of applications, including semiconductor lasers.

16 Claims, 9 Drawing Sheets

U.S. PATENT DOCUMENTS

| | | |
|---|---|---|
| 6,782,021 B2 | 8/2004 | Huang et al. |
| 6,816,525 B2 | 11/2004 | Stintz et al. |
| 2001/0050934 A1 | 12/2001 | Choquette et al. |
| 2002/0022286 A1 | 2/2002 | Nikolaev et al. |
| 2002/0051615 A1 | 5/2002 | Walpole et al. |
| 2002/0114367 A1 | 8/2002 | Stintz et al. |
| 2003/0036217 A1 | 2/2003 | Richard et al. |

OTHER PUBLICATIONS

Asryan, L.V et al. "Charge Neutrality Violation In Quantum -Dot Lasers; IEEE Journal Of Selected Topics In Quantum Electronics" vol. 3, No. 2; Apr. 1997; pp. 148-157.

Bimberg, D. et al. "InGaAs-GaAs Quantum Dot Lasers; IEEE Journal Of Selected Topics in Quantum Electronics," vol. 3, No. 2; Apr. 1997; pp. 196-205.

Bloch, J. et al., "Room-temperature 1.3 um emission from InAs quantum dots grown by metal organic chemical vapor deposition," Applied Physics Letters, American Institute of Physics, New York, U.S., vol. 75, No. 15, Oct. 11, 1999, pp. 2199-2201.

Bossert, D.J. et al. "Improved Method For Gain/Index Measurements Of Semiconductor Lasers; Electronics Letters" vol. 32, No. 4; Feb. 15, 1996; pp. 338-339.

Bossert, David J. et al. "Gain, Refractive Index, And alpha.-Parameter In InGaAs-GaAs SQW Broad-Area Lasers." IEEE Photonics Technology Letters, vol. 8, No. 3; Mar. 1996; pp. 322-324.

Brandt, O. "Formation And Morpholoyg Of InAs/GaAs Heterointerfaces;" Physical Review; vol. 45, No. 15; Apr. 15, 1992; pp. 8443-8452.

Brault, J. et al. "Role Of Buffer Surface Morphology And Alloying Effects On The Properties Of InAs Nanostructures Grown On InP(001)" Applied Physics Letters; vol. 73, No. 20; Nov. 16, 1998; pp. 2932-2934.

Brault, J. et al. "Staggered Vertical Self-Organization Of Stacked InAs/InA1As Quantum Wires On INP(001)" Applied Surface Science; vol. 162-163; Aug. 2000; pp. 584-589.

Choo, Heung Ro. et al. "Improvement Of Linewidth Enhancement Factor In 1.55-mu.m Multiple-Quantum-Well Laser Diodes" IEEE Photonics Technology Letters; vol. 10, No. 5; May 1998; pp. 645-647.

Chou, S.T. et al. "Growth Of Gaxln1-x As Quantum Wire Heterostructures By The Strain-Induced Lateral-Layer Ordering Process" J. Vac. Sci. Technol. B.; vol. 13, No. 2; Mar./Apr. 195; pp. 650-652.

Chyi, Jen-Inn et. al. "Formation Of Self-Organized In0.5Ga0.5 As Quantum Dots On GaAs By Molecular Beam Epitaxy." Journal Of Crystal Growth; vol. 175, 176; 1997; pp. 777-781.

Dutta, N.K. et al. "Strain Compensated InGaAs-GaAsP-InGaP Laser"; IEEE Photonics Technology Letters vol. 8, No. 7; Jul. 1996; pp. 852-854.

Eliseev, P.G.et al. "Gain In Ultra-Low-Threshold InAs/InGaAs Quantum Dot Lasers; Conference" 2000 IEEE 17.sup.th International Semiconductor Laser Conference; Sep. 25-28, 2000; pp. 65-66.

Eliseev, P.G. et al. "Ground-State Emission And Gain In Ultralow-Threshold InAs-InGaAs Quantum-Dot Lasers" IEEE Journal On Selected Topics In Quantum Electronics; vol. 7, No. 2; Mar./Apr. 2001; pp. 135-142.

Eliseev, P.G. et al. "Optical Gain In InAs/InGaAs Quantum -Dot Structures; Experiments And Theoretical Model" Quantum Electronics 30 (8); 2000; pp. 664-668.

Eliseev, P.G. et al. "Transition Dipole Moment Of InAs/InGaAs Quantum Dots From Experiments On Ultralow-Threshold Laser Diodes" Applied Physics Letters, vol. 77, No. 2; Jul. 10, 2000; pp. 262-264.

Eliseev, P.G. et al. "Tunable Grating-Coupled Laser Oscillation And Spectral Hole Burning In An InAs Quantum-Dot Laser Diode" IEEE Journal Of Quantum Electronics; vol. 36, No. 4; Apr. 2000; pp. 479-485.

Evans, P.W. et al., "Edge-emitting quantum well heterostructure laser diodes with auxiliary native-oxide vertical cavity confinement," Applied Physics Letters, American Institute of Physics, New York, U.S., vol. 67, No. 21, Nov. 20, 1995, pp. 3168-3170.

Fiore, A. et al. "Time-Resolved Characterization Of InAs/InGaAs Quantum Dot Gain Material For 1.3 um Laser On Gallium Arsenide" CLEO 2000 Conference; May 2000; p. 348.

Garcia, J.M. et al., "Electronic states tuning of InAs self-assembled quantum dots," Applied Physics Letters, American Institute of Physics, New York, U.S., vol. 72, No. 24, Jun. 15, 1998, pp. 3172-3174.

Gingrich, H.S.et al. "Broadly Tunable External Cavity Laser Diodes With Staggered Thickness Multiple Quantum Wells" IEEE Photonics Technology Letters; vol. 9, No. 2; Feb. 1997; pp. 155-157.

Gonzalez, L. et al. "Influence Of Buffer-Layer Surface Morphology On The Self-Organized Growth Of InAs On InP(001) Nanostructures" Applied Physics Letters; vol. 76, No. 9; Feb. 28, 2000; pp. 1104-1106.

Grundmann, M.; and Bimberg, D.; "Theory Of Random Population For Quantum Dots" Physical Review B; vol. 55, No. 15; Apr. 15, 1997; pp. 9740-9745.

Guo, S.P. et al. "InAs Self-Organized Quantum Dashes Grown On GaAs (211)B" Appl. Phys. Letters, vol. 70, No. 20; May 19, 1997; pp. 2738-2740.

Hakki, Basil W., and Paoli, Thomas L. "Gain Spectra In GaAs Double-Heterostructure Injection Lasers" Journal Of Applied Physics, vol. 46, No. 3; Mar. 1975; pp. 1299-1306.

Hinzer, K. et al. "Room Temperature Operation Of AllnAs/AlGaAs Quantum Dot Lasers" Physica E, vol. 2; 1998; pp. 729-733.

Huang, X. et al. "Efficient High-Temperature CW Operation Of Oxide Confined Long-Wavelength InAs Quantum Dot Lasers" CLEO 2000 Conference; May 2000; pp. 348-349.

Huang, Xiaodong et al. "Demonstration Of Passive Q-Switching And Passive Mode-Locking In 1.3 .mu.m. Two-Section InAs Quantum Dot Lasers" Conference: CLEO 2001; May 2001; p. 359.

Huang, Xiaodong et al. "Efficient High-Temperature CW Lasing Operation Of Oxide-Confined Long-Wavelength InAs Quantum Dot Lasers" Electronics Letters; vol. 36, No. 1; Jan. 6, 2000.

Huang, Xiaodong et al. "Very Low Threshold Current Density Room Temperature Continuous-Wave Lasing From A Single-Layer InAs Quantum-Dot Laser" IEEE Photonics Technology Letters, vol. 12, No. 3; Mar. 2000; pp. 227-229.

Huffaker, D.L.; and Deppe, D.G. "Electroluminescence Efficiency of 1.3 um Wavelength InGaAs/GaAs Quantum Dots" Applied Physics Letters; vol. 73, No. 4; Jul. 27, 1998, pp. 520-522.

Kaspi, R. "Improved Compositional Abruptness At The InGaAs On GaAs Interface By Presaturation With In During Molecular-Beam Epitaxy" Appl. Phys. Lett.; vol. 67, No. 6; Aug. 7, 1995; pp. 819-821.

Kim, Jin K. et al., "Lateral Carrier Confinement in Miniature Lasers Using Quantum Dots," IEEE Journal of Selected Topics in Quantum Electronics, IEEE Service Center, U.S., vol. 6, No. 3, May/Jun. 2000, pp. 504-510.

Kirstaedter, N. et al. "Low Threshold, Large T0 Injection Laser Emission From (InGa)As Quantum Dots" Electronics Letters, vol. 30, No. 17; Aug. 18, 1994; pp. 1416-1417.

Komori, Kazuhiro et al., "Noise Study of Low-Dimensional Quantum-Well Semiconductor Laser Amplifiers," IEEE Journal of Quantum Electronics, IEEE Inc., New York, US, vol. 28, No. 9, Sep. 1, 1992, pp. 1894-1900.

Ledentsov N.N. et al., "Interconnection between gain spectrum and cavity mode in a quantum-dot vertical-cavity laser," Semiconductor Science and Technology, Institute of Physics, London, G.B., vol. 14, No. 1, 1999, pp. 99-102.

Lester, Luke F. "Materials Growth And Device Characterization Of InAs Quantum Dot Lasers" Conference: LEOS; Nov. 15, 2000.

Lester, L.F. et al. "Optical Characteristics Of 1.24 um InAs Quantum-Dot Laser Diodes" IEEE Photonics Technology Letters, vol. 11, No. 8, Aug. 1999; pp. 931-933.

Li, H. et al. "150-nm Tuning In A Grating-Coupled External Cavity Quantum-Dot Laser" 2000 CLEO Europe Conference; Sep. 2000.

Li, H. et al. "150-nm Tuning Range In A Grating-Coupled External Cavity Quantum-Dot Laser" IEEE Photonics Technology Letters, vol. 12, No. 7, Jul. 2000; pp. 759-761.

Li, H. et al. "Carrier Lifetime And Radiative Recombination In Quantum Dot LEDs" IEEE 2000 LEOS Annual Meeting: Nov. 2000; pp. 376-377.

Li, Y.F. et al. "Influence Of Growth Conditions On Self-Assembled InAs Nanostructures Grown On (001)InP Substract By Molecular Beam Epitaxy" Journal of Crystal Growth; vol. 223; 2001; pp. 518-522.

Li, Y.F. et al. "Room Temperature 1.55 um Emission From InAs Quantum Dots Grown On (001)InP Substrate By Molecular Beam Epitaxy" Journal Of Crystal Growth; vol. 218; 2000; pp. 451-454.

Li, Yue-Fa et al. "InAs Self-Assembled Nanostructures Grown On InP(001)" Chinese Physics; vol. 9, No. 3; Mar. 2000; pp. 222-224.

Lian, G.D. et al. "Modification Of InAs Quantum Dot Structure By The Growth Of The Capping Layer" Applied Physics Letters; vol. 73, No. 1; Jul. 6, 1998; pp. 49-51.

Liu, G.T. et al. "Modal Gain And T0 Value Improvements In Quantum Dot Lasers Using Dots-In-A-Well (DWELL) Structure" IEEE 2000 International Semiconductor Laser Conference; Sep. 2000; pp. 133-134.

Liu, G.T. et al. "Ultra-Low Threshold Current Density Quantum Dot Lasers Using The Dots-In-A-Well (DWELL) Structure" Conference: Physics And Simulation Of Optoelectronic Devices-Conference 8th ; Proceedings—SPIE The International Society For Optical Engineering; vol. 3944; 2000; pp. 814-822.

Liu, G.T. et al. "Extremely Low Room-Temperature Threshold Current Density Diode Lasers Using InAs Dots In In0.15 Ga0.85 As Quantum Well" Electronics Letters; vol. 35, No. 14; Jul. 8, 1999.

Liu, G.T. et al. "1.25 um Low Threshold Current Density Dots-In-A-Well (DWELL) Lasers" Conference: 1999 Digest Of The LEOS Summer Topical Meetings: Nanostructures And Quantum Dots/WDM Components/VCSELs And Microcavities/RF Photonics For CATV And HFC Systems; Jul. 26-30, 1999.

Liu, G.T. et al. "The Influence Of Quantum-Well Composition On The Performance Of Quantum Dot Lasers Using InAs/InGaAs Dots-In-A-Well (DWELL) Structures" IEEE Journal Of Quantum Electronics, vol. 36, No. 11; Nov. 2000; pp. 1272-1279.

Liu, G.T. et al. "One And Three-Stack Quantum Dot Lasers With Very Low Threshold Current Density" Conference: Conference On Lasers And Electo-Optics (CLEO 2000); May 2000; pp. 346-347.

Liu, G.T. et al. "1.58 um Lattice-Matched And Strained Digital Alloy AlGaInAs-InP Multiple-Quantum-Well Lasers" IEEE Transactions On Photonics Letters; vol. 12; 2000.

Liu, Guangtian; "Characteristics Of Ultralow Threshold Quantum-Dot Lasers Using InAs/InGaAs Dots-In-A-Well Structures; Thesis (Ph.D.)" University of New Mexico; Dept. of Electrical And Computer Engineering; Dec. 2000; pp. 1-120.

Liu, Guangtian; "Very Low Room-Temperature Threshold Current Density Dots In A Well (DWELL) Lasers" Conference: 1999 IEEE LEOS Annual Meeting Conference Proceedings. LEOS'99; 12 Annual Meeting; IEEE Lasers And Electro-Optics Society; Nov. 1999; vol. 2; pp. 469-470.

Lott, J.A. et al. "InAs-InGaAs Quantum Dot VCSELs On GaAs Substrates Emitting at 1.3um" Electronics Letters; vol. 36, No. 16; Aug. 3, 2000.

Marciante, John.R. et al. "Spatio-Temporal Characteristics Of Filamentation In Broad-Area Semiconductor Lasers" IEEE Journal Of Quantum Electronics, vol. 33, No. 7; Jul. 1997; pp. 1174-1179.

Maximov, Mikhail V. et al. "InGaAs/GaAs Quantum Dot Lasers With Ultrahigh Characteristic Temperature (T0=385K) Grown By Metal Organic Chemical Vapour Deposition" Jpn. J. Appl. Phys.; vol. 36, Pt. 1, No. 6B; 1997; pp. 4221-4223.

Mehuys, D. et al. "Optimised Fabry-Perot (AlGa)As Quantum-Well Lasers Tunable Over 105nm" Electronic Letters; vol. 25, No. 2: Jan. 19, 1989, pp. 143-145.

Mirin, R. et al. "Room Temperature Lasing From InGaAs Quantum Dots" Electronics Letters; vol. 32, No. 18; Aug. 29, 1996; pp. 1732-1734.

Morton, P.A. et al. "Gain Characteristics Of 1.55um High_Speed Multiple-Quantum-Well Lasers" IEEE Photonics Technology Letters, vol. 7, No. 8; Aug. 1995; pp. 833-835.

Mukai, K. et al. "High Characteristic Temperature Of Near-1.3um InGaAs/GaAs Quantum-Dot Lasers" CLEO 2000 Conference; May 2000; pp. 345-346.

Mukai, K.et al."Lasing With Low Threshold Current And High Output Power From Columnar-Shaped InAs/GaAs Quantum Dots" Electronics Letters; vol. 34, No. 16; Aug. 6, 1998, pp. 1588-1590.

Mukai, Kohki et al. "Growth And Optical Evaluation Of InGaAs/GaAs Quantum Dots Self-Formed During Alternate Supply Of Precursors" Applied Surface Science, vol. 112; Mar. 1997; pp. 102-109.

Mukai, Kohki; et al. "Self-Formed In0.5 Ga0.5 As Quantum Dots On GaAs Substrates Emitting At 1.3um" Jpn. J. Appl. Phys. vol. 33, Part 2, No. 12A; Dec. 1, 1994; pp. 1710-1712.

Newell, T.C. et al. "Gain And Linewidth Enhancement Factor In InAs Quantum-Dot Laser Diodes" IEEE Photonics Technology Letters; vol. 11, No. 12; Dec. 1999; pp. 1527-1529.

Newell, T.C. et al. "Broadening Mechanisms, Gain, And Low Linewidth Enhancement Factor In InAs Quantum Dot Lasers" Conference: CLEO 2000; May 2000; p. 363.

Newell, T.C. et al. "Optical Characteristics And Low Linewidth Enhancement Factor in 1.2 .mu.m Quantum Dot Lasers; Conference" 1999 IEEE LEOS Annual Meeting Conference Proceedings; LEOS'99; 12.sup.th Annual Meeting; IEEE Lasers And Electro-Optics Society 1999 Annual Meeting; Nov. 8-11, 1999.

Newell, T.C.et al. "High-Power AlGaInAs Strained Multiquantum Well Lasers Operating At 1.52 um" Electronics Letters; vol. 36, No. 11; May 25, 2000.

Newell, T.C. et al. "1.5 um AlGaInAs Quantum Well Lasers Grown By The Ditigal Alloy Technique" Conference: CLEO 2000; May 2000; pp. 174-175.

Nishi, Kenichi et al. "A Narrow Photoluminescence Linewidth of 21 meV at 1.35 um From Strain-Reduced InAs Quantum Dots Covered By In0.2 Ga0.8 As Grown On GaAs Substrates" Applied Physics Letters; vol. 74, No. 8; Feb. 22, 1999; pp. 1111-1113.

Park, G.et al. "Very Low Threshold Oxide-Confined 1.3 um GaAs-Based Quantum Dot Laser" CLEO 2000 Conference; May 2000; pp. 349-350.

Park, Gyounwonet al. "Room-Temperature Continuous-Wave Operation Of A Single-Layered 1.3um Quantum Dot Laser" Applied Physics Letters, vol. 75, No. 21; Nov. 22, 1999; pp. 3267-3269.

Park, Gyoungwon et al., "Temperature Dependence of Gain Saturation in Multilevel Quantum Dot Lasers," IEEE Journal of Quantum Electronics, IEEE Inc., New York, U.S., vol. 36, No. 9, Sep. 2000, pp. 1065-1071.

Prieto, J.A. et al. "Strain-Induced Optical Anisotropy In Self-Organized Quantum Structures At The E1 Transition" Applied Physics Letters; vol. 76, No. 16; Apr. 17, 2000; pp. 2197-2199.

Qiu, Y. et al. "High-Performance InAs Quantum Dot Lasers Near 1.3 um" Applied Physics Letters; vol. 79, No. 22; Nov. 26, 2001; pp. 3570-3572.

Qiu, Y.et al. "High Temperature Continuous Wave Operation Of InAs Quantum Dot Lasers Near 1.3 um" Conference: IEEE Lasers & Electro-Optics Society; LEOS Conference; Nov. 12-16, 2001; pp. 267-268.

Saito, Hideaki et al., "Room-temperature lasing operation of a Quantum-dot vertical-cavity surface-emitting laser," Applied Physics Letters, American Institute of Physics, New York, US, vol. 69, No. 21, Nov. 18, 1996, pp. 3140-3142.

Saito, Hideaki et al., "Controlling polarization of quantum-dot surface-emitting lasers by using structurally anisotropic self-assembled dots," Applied Physics Letters, American Institute of Physics, New York, U.S., vol. 71, No. 5, Aug. 4, 1997, pp. 590-592.

Sakaki, Hiroyuki "Quantum Wires, Quantum Boxes And Related Structures; Physics, Device Potentials And Structural Requirements" Surface Science; vol. 267; 1992; pp. 623-629.

Schur, Richard et al., "Vertical Microcavity Lasers with InGasAs/GaAs Quantum Dots Formed by Spinodal Phase Separation," Japanese Journal of Applied Physics, Tokyo, Japan, vol. 36, No. 3B, Mar. 15, 1997, pp. 357-360.

Shchekin, Oleg B. et al., "Low-Threshold Continuous-Wave Two-Stack Quantum-Dot Laser with Reduced Temperature Sensitivity,"

IEEE Photonics Technology Letters, IEEE Inc., New York, U.S., vol. 12, No. 9, Sep. 2000, pp. 1120-1122.

Shernyakov, Yu.M. et al. "1.3um GaAs-Based Laser Using Quantum Dots Obtained By Activated Spinodal Decomposition" Electronics Letters; vol. 35, No. 11; May 27, 1999; pp. 898-900.

Shoji, H.; "Lasing At Three-Dimensionally Quantum-Confined Sublevel Of Self-Organized In0.5 Ga0.5 As Quantum Dots By Current Injection" IEEE Photonics Technology Letters, vol. 7, No. 12; Dec. 1995; pp. 1385-1387.

Stintz, A. et al. "Characterization Of InAs Quantum Dots In Strained Inx Ga1-x As Quantum Wells" J.Vac.Sci.Technol.; vol. B 18(3); May/Jun. 2000; pp. 1496-1501.

Stintz, A. et al. "Low-Threshold Current Density 1.3um InAs Quantum-Dot Lasers With The Dots-In-A-Well (DWELL) Structure" IEEE Photonics Technology Letters; vol. 12, No. 6; Jun. 2000; pp. 591-593.

Tabuchi, H.; and Ishikawa H. "External Grating Tunable MQW Laser With Wide Tuning Range Of 240nm" Electronic Letters; vol. 26, No. 11; May 24, 1990; pp. 742-743.

Thomson, J.D. et al. "Temperature Insensitive Quantum Dot Structures For Vertical Cavity Lasers" CLEO 2000 Conference; May 2000; pp. 347-348.

Ustinov, V.M.; "InAs/InGaAs Quantum Dot Structures On GaAs Substrates Emitting at 1.3um" Applied Physics Letters; vol. 74, No. 19; May 10, 1999; pp. 2815-2817.

Ustinov, V.M. et al., "High output power CW operation of a quantum dot laser," Compound Semiconductors 1999, Proceedings of the 26.sup.th International Symposium on Compound Semiconductors, Berlin, Germany, Aug. 22-26, 1999, Institute of Physics Conference Series, IOP Publishing Ltd., London, G.B., No. 166, pp. 277-280.

Utzmeier, T. et al., "Growth and characterization of self-organized InSb quantum dots and quantum dashes," Journal of Crystal Growth, North-Holland Publishing Co., Amsterdam, The Netherlands, vol. 175-176, May 1, 1997, pp. 725-729.

Varangis, P.M. et al. "Low-Threshold Quantum Dot Lasers With 201nm Tuning Range" Electronics Letters; vol. 36, No. 18; Aug. 31, 2000.

Varangis, P.M.; "183 nm Tuning Range In A Grating-Coupled External-Cavity Quantum Dot Laser" IEEE 2000 International Semiconductor Laser Conference; Sep. 2000; pp. 137-138.

Wang, R.H. et al. "Low Threshold Oxide-Confined InAs Quantum Dash Ridge Waveguide Lasers On InP Substrates" Conference: IEEE Lasers & Electro-Optics Society; LEOS Conference; Nov. 12-16, 2001; pp. 405-406.

Wang, R.H. et al. "Room Temperature Operation Of InAs Quantum-Dash Lasers On InP (001)" IEEE Photonics Technology Letters; vol. 13, No. 8; Aug. 2001; pp. 767-769.

Wang, Ronghua et al. "1.6 um Single And Multiple-Stack Room Temperature Quantum Dash Lasers On InP" Conference: CLEO (Conference On Lasers And Electro Optics)/QELS Plenary Session And Awards Ceremony; May 9, 2001.

Wang, Zhanguo; et al. "Self-Assembled InAs/GaAs Quantum Dots And Quantum Dot Laser" Science in China; vol. 43, No. 8; Aug. 2000; pp. 861-870.

Wasilewski, Z.R. et al. "Size And Shape Engineering Of Vertically Stacked Self-Assembled Quantum Dots" Journal Of Crystal Growth; vol. 201, 202; 1999; pp. 1131-1135 (No Month).

Willatzen, M. et al. "Polarization Dependence Of Optoelectronic Properties In Quantum Dots And Quantum Wires—Consequences Of Valence-Band Mixing" IEEE Journal of Quantum Electronics; vol. 30, No. 3; Mar. 1994; pp. 640-653.

Zhukov, A.E. et al. "Photo And Electroluminescence In The 1.3 um Wavelength Range From Quantum-Dot Structures Grown On GaAs Substrates" Semiconductors; vol. 33, No. 2; Feb 1999; pp. 153-156.

Utzmeier, T. et al. "Transition from self-organized InSb quantum-dots to quantum dashes" Appl. Phys. Lett. pp. 2674-2676, No. 18, vol. 69, 1996.

Ponchet, A. et al. "Relationship between self-organization and size of InAs islands on InP(001) grown by gas-source molecular beam epitaxy" Appl. Phys. Lett. pp. 1850-1852, No. 13, vol. 67, 1995.

Colocci, M. et al., "Growth patterns of self-assembled InAs quantum dots near the two dimensional to three dimensional transition", Appl. Phys. Lett., pp. 3140-3142, No. 23 vol. 70, 1997.

P.N. Brunkov, et al. "Emission of Electrons from the Ground and First Excited States of Self-Organized InAs/GaAs Quantum Dot Structures" J. Electron. Mater. pp. 486-490, No. 5, vol. 28, 1999.

Guo, Shiping et al. "Photoluminescence Study of InAs Quantum Dots and Quantum Dashes Grown on GaAs(211)B." Jpn. J. Appl. Phys. pp. 1527-1531, No. 3B, vol. 37, 1998.

| Ref. | Layer | Material | Thickness |
|---|---|---|---|
| 750 | Cap | InGaAs (Lattice Matched to InP), p Doped 1.5E19 | 100 nm |
| 747 | Grading | AlGaInAs (Lattice Matched to InP), p Doped 5E17-1.5E19 | 20 nm |
| 745 | Cladding | AlInAs (Lattice Matched to InP), p Doped 5E17 | 1100 nm |
| 745 | Cladding | AlInAs (Lattice Matched to InP), p Doped 1E17 | 400 nm |
| 740 | Waveguiding | $Al_{.30}Ga_{.18}In_{.52}As$ | 105 nm |
| 735 | Barrier | $Al_{.28}Ga_{.22}In_{.50}As$ | 15 nm |
| 730 | Top Quantum Well | $Al_{.20}Ga_{.16}In_{.64}As$ | 6.3 nm |
| 725 | Quantum Dots | InAs | 4.0 Monolayers |
| 720 | Bottom Quantum Well | $Al_{.20}Ga_{.16}In_{.64}As$ | 1.3 nm |
| 715 | Barrier | $Al_{.28}Ga_{.22}In_{.50}As$ | 15 nm |
| 710 | Waveguiding | $Al_{.30}Ga_{.18}In_{.52}As$ | 105 nm |
| 705 | Cladding | AlInAs (Lattice Matched to InP), n Doped 1E17 | 500 nm |
| 704 | Graded Interface | AlGaInAs (Lattice Matched to InP), n Doped 1E18 | 20 nm |
| 702 | Substrate | InP, n Doped, (100) Misoriented +/-3° (111)B | |

Rows 735–715 repeated ×5.

FIG. 6A — Symmetric and Asymmetric Quantum Dots (Arsenic Rich 2x1 Reconstruction)

FIG. 6B — Asymmetric Quantum Dots (Arsenic Stable/Rich 2x4)

QUANTUM DOT STRUCTURES

CROSS-REFERENCE TO RELATED APPLICATION

This application claims priority under 35 U.S.C. § 119(e) to U.S. Provisional Patent Application Ser. No. 60/514,211, "Quantum Dot Structures," filed Oct. 24, 2003 by Allen L. Gray et al. The subject matter of the foregoing is incorporated herein by reference in its entirety.

BACKGROUND OF THE INVENTION

1. Field of the Invention

The present invention relates generally to semiconductor quantum dot structures and devices.

2. Description of the Related Art

A semiconductor quantum dot is a structure having energy barriers that provide quantum confinement of electrons and holes in three dimensions. Because of these properties, there is interest in using quantum dot structures in a variety of electronic and optoelectronic devices. For example, studies indicate that quantum dot lasers can potentially perform better than conventional quantum well lasers in many respects. A quantum dot laser can have a lower fill factor (i.e., volume of material to be pumped) and/or an improved density of states function compared to a quantum well laser. Studies also indicate that the threshold current of a semiconductor laser may be improved by using quantum dot active regions, due to the smaller volume of material and reduced number of states.

Quantum dot lasers emitting light in the 1.3 to 1.6 micron wavelength range are particularly interesting for fiber optic communication systems. In particular, there has been interest in using InAs quantum dots as the active region for semiconductor lasers. Conventional approaches to creating InAs quantum dots are typically based on spontaneous processes that occur when growing strained on GaAs or InP substrates. Unfortunately, these conventional approaches have significant drawbacks that limit the usefulness of the resulting quantum dot structures, particularly in the 1.3 to 1.6 micron wavelength range.

For example, one important challenge is controlling the shape of the quantum dot. Usually, a high degree of symmetry in the shape of the quantum dot is desirable. For instance, a spherical quantum dot results in isotropic optical properties that can be important in certain optoelectronic applications. However, conventional approaches have not been able to produce symmetric InAs quantum dots on an InP substrate in a manner that is useful for optoelectronic devices. Instead, the resulting quantum dots are elongated in shape and generally referred to as quantum dashes. The resulting devices are highly anisotropic and the lack of symmetry limits the device performance. Attempts to create more symmetric InAs quantum dots have resulted in inadequate device properties, such as high threshold current, low modal gain and strong temperature dependence. These deficiencies are believed to be caused by a failure to achieve the desired shape and/or density for the InAs quantum dots.

Thus, there is a need to create improved quantum dot structures.

SUMMARY OF THE INVENTION

One aspect of the present invention overcomes the limitations of the prior art by fabricating more symmetric quantum dots embedded in a quantum well. In one approach, the symmetry is achieved by using slightly off-axis substrates and/or overpressure during the quantum dot formation.

For example, in one implementation, InAs quantum dots are embedded in an AlGaInAs quantum well and the substrate is a slightly off-axis (100) InP substrate (e.g., misoriented towards either the (110) or (111) directions). The growth conditions for the InAs quantum dots include an As overpressure of between two and five. The resulting InAs quantum dots have a mean height of between 2 and 5 nm, a mean width of between 15 and 25 nm, a mean length of between 15 and 25 nm and a mean length-to-width ratio of between 1:1 and 3:1.

Other aspects of the invention include various devices based on these structures and methods for operating these structures. For example, in one embodiment, the quantum dot structures are used as the active region of a semiconductor laser with a lateral laser cavity. For slightly off-axis (100) InP substrates that are misoriented towards the (110) or (111) directions, the lateral laser cavity preferably is aligned to the (011) or (01$\bar{1}$) directions, respectively.

BRIEF DESCRIPTION OF THE DRAWING

The invention has other advantages and features which will be more readily apparent from the following detailed description of the invention and the appended claims, when taken in conjunction with the accompanying drawing, in which:

DETAILED DESCRIPTION OF THE PREFERRED EMBODIMENTS

Figure 1A:
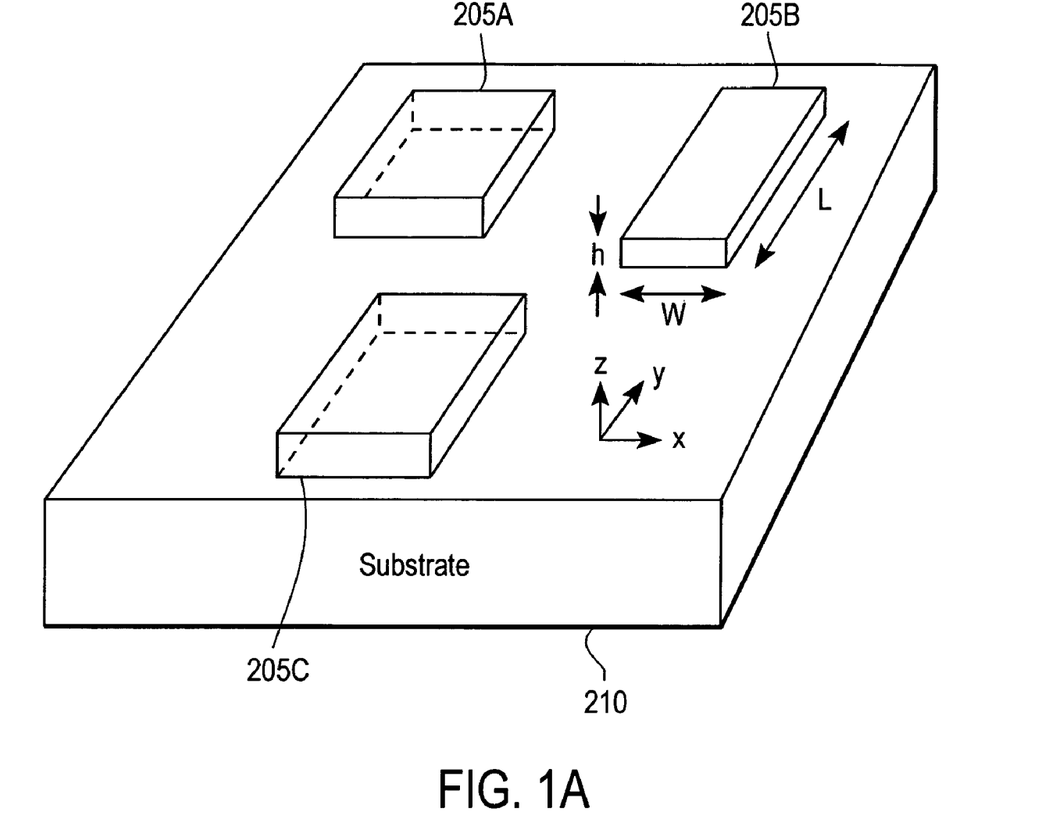
FIG. 1A is a perspective view of a core region of quantum dots.

FIG. 1A is a perspective view illustrating the dimensions of one example of a core region with quantum dots. The quantum dots 205 have a mean height h, width w and length l. In one embodiment, each of the three dimensions (h, w, and l) of the quantum dot is selected to be less than the room temperature thermal de Broglie wavelength. In the example of FIG. 1A, the quantum dots 205A-205C are depicted as spaced apart mesas formed on a semiconductor substrate 210. However, in other embodiments, the quantum dots 205 can take shapes other than rectangular mesas.

Figure 1B:
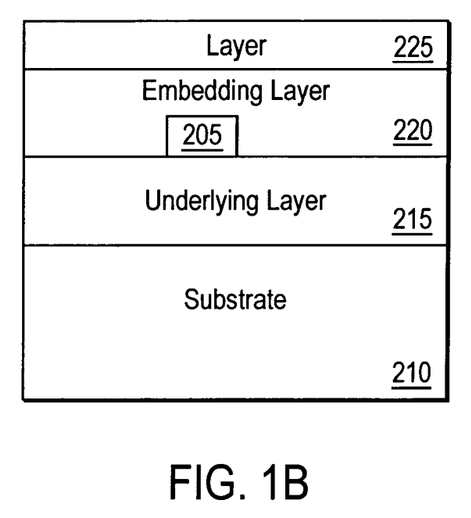
FIG. 1B is a side view showing an embedded quantum dot.
Figure 1C:
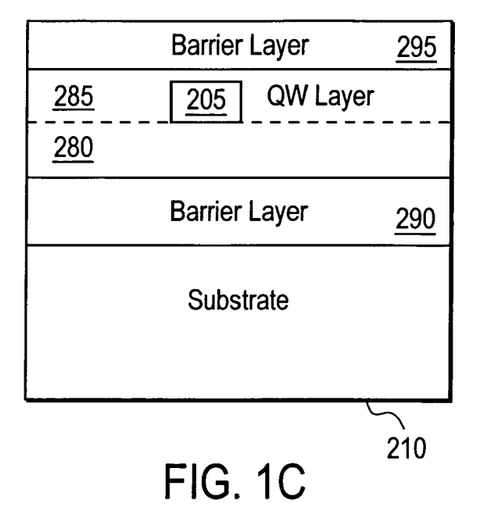
FIG. 1C is a side view showing a quantum dot embedded in a quantum well.

As shown in the side view of FIG. 1B, in this example, an underlying layer (or layers) 215 is first formed on a substrate 210. The quantum dots 205 are embedded in an embedding layer 220. Additional layer(s) 225 may also be grown. As shown in the side view of FIG. 1C, in one embodiment, the quantum dots 205 are formed in quantum wells having a bottom barrier layer 290, first and second quantum well layers 280, 285, and a top barrier layer 295. The material composition of the layers is preferably selected so that thick layers are lattice matched or nearly lattice matched (e.g., less than the critical thickness for dislocation formation) to prevent the formation of misfit dislocations. However, the quantum dots and individual layers may be pseudomorphic strained layers.

Referring again to FIG. 1A, the height of the quantum dots 205 is measured in a direction perpendicular to the plane of the substrate 210, along a z-axis corresponding to the direction of growth. Thus, the height h may also be referred to as the thickness of a layer. For example, layers that are grown in the z direction are commonly described by a growth thickness. The length and width of the quantum dots 205 are measured in x and y directions parallel to the growth plane (i.e., a plane parallel to the plane of the substrate).

In one embodiment, the quantum dots are typically 2-12 nm high and 10-30 nm wide (in each direction). The height h of each quantum dot preferably is equal to or less than its width, and the quantum dots preferably are not elongated and maintain a mean length-to-width ratio in the range of 1:1 to 3:1. The distribution of the size and shape of the quantum dots preferably is also selected so that the quantum dots have a ground state energy level that saturates at room temperature and have a sequence of excited states that have an energy level separation that facilitates forming a high, broad optical gain spectrum. In a preferred embodiment, the quantum dots are fabricated as self-assembled structures (sometimes also known as "self-organized structures") in a III-V compound semiconductor materials system. In these materials systems, examples of the group III element include Al, Ga and In and examples of the group V element include N, P, As and Sb. Many different III-V semiconductor alloy compositions can be used, based on the known relationships between bandgap energy and lattice constant of different III-V compounds. GaAs and InP are the most commonly used III-V compound semiconductor substrates, although other types of substrates may also be used as well.

A variety of crystal growth techniques may also be used. Typically, the growth technique will have sufficient surface kinetic reactions (e.g., surface ad-atom or molecular migration) to favor island growth in response to the growth of a higher lattice constant material upon a lower lattice constant material. Examples of suitable growth techniques include molecular beam epitaxy (MBE), gas source MBE (GSMBE) and metallo-organic chemical vapor deposition (MOCVD).

Figure 2A:
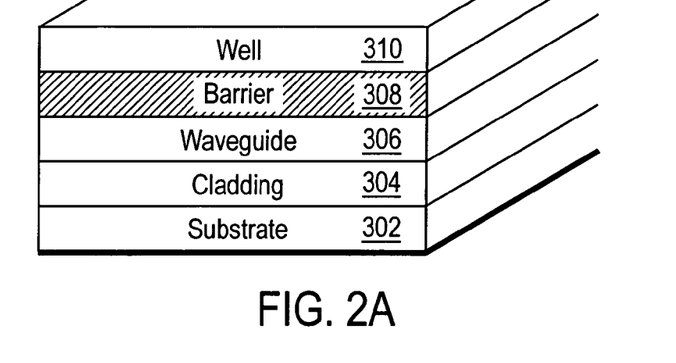
FIGS. 2A-2C are perspective views illustrating some of the steps used to form a quantum dot laser.
Figure 2B:
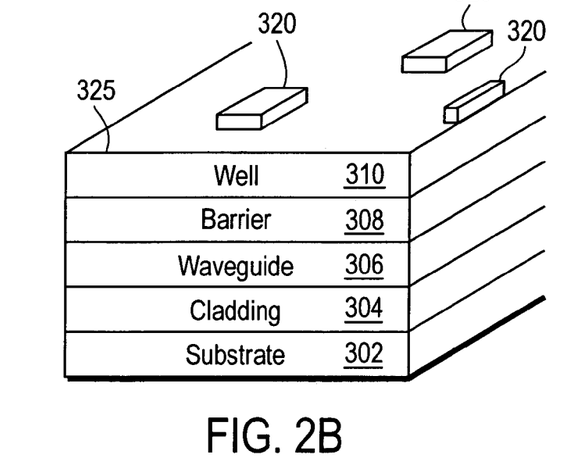
Figure 2C:
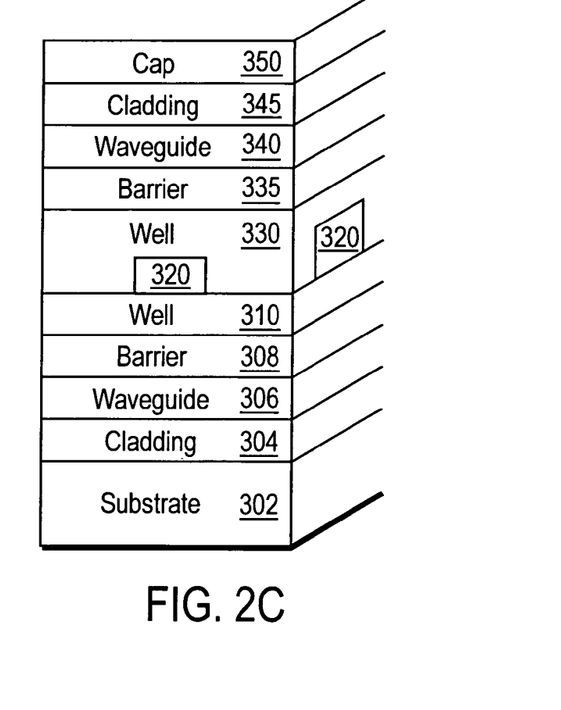

FIGS. 2A-2C illustrate some aspects of the fabrication of self-assembled quantum dots according to the invention. In FIG. 2A, the semiconductor substrate 302 is a slightly off-axis substrate (as will be further described below). The vicinal substrate 302 has a staircase shape with ledges/terraces that facilitate island growth. Ignoring layers 304-308 for the moment, a substantially planar III-V compound semiconductor support layer 310 is grown. For example, if substrate 302 is InP, then support layer 310 might be AlGaInAs or InGaAsP. The support layer 310 may be grown either directly on the substrate 302 or upon other layers previously grown on the substrate. In the embodiment of FIG. 2A, the support layer 310 is part of a quantum well grown on an underlying barrier layer 308, a waveguide layer 306, and a cladding layer 304. In one embodiment, the growth parameters of the support layer 310 are selected to achieve a mean surface roughness of less than 0.3 nm.

Referring to FIG. 2B, growth parameters are selected to form self-assembled islands 320 during deposition of a compound semiconductor on the support layer 310. The deposited compound semiconductor 320 has a lower bandgap than the support layer 310 and also has a larger relaxed lattice constant than the underlying layer 310 (e.g., InAs quantum dots grown on AlGaInAs). In particular, the lattice mismatch of the lower bandgap semiconductor 320 is preferably selected to be at least about 1.8% greater than the underlying semiconductor layer 310 to produce a Stranski-Krastanow (S-K) growth mode. In the S-K growth mode, the driving force for the formation of islands is the reduction in strain energy afforded by elastic deformation, i.e., for S-K growth it is more energetically favorable to increase surface energy by islanding than by relaxing strain by dislocation generation. In a S-K growth mode, the growth becomes three dimensional after a critical thickness of the larger lattice constant material is grown upon an initial wetting layer 325.

In this case, selection of the growth parameters controls the height and the length-to-width ratio of the islands to form more symmetric quantum dots. In particular, overpressure of the group V element is applied during growth of the semiconductor 320, resulting in quantum dots with a length-to-width ratio of not more than 3:1. One advantage of this technique is that more symmetric quantum dots can be grown, even for systems with lower strains.

As shown in FIG. 2B, each island 320 is a quantum dot that has a nominal height, width and length. The islands tend to be aligned along a preferred crystal orientation. A residual wetting layer 325 may remain on the surface of well portion 310. After the self-assembled islands are formed, they are embedded in a higher bandgap material 330 (e.g., a layer of AlGaInAs or InGaAsP), as shown in FIG. 2C. Factors such as interdiffusion, phase segregation, and spinodal decomposition during the embedding process preferably are taken into account because they may affect the shape and composition of the quantum dots. In one embodiment, the quantum dots 320 are embedded in the remainder 330 of the quantum well, followed by another barrier layer 335, waveguide layer 340, cladding layer 345, and cap layer 350. Each quantum dot thus consists of an island of low bandgap material surrounded on all sides by a higher bandgap material. The island formation process can be repeated to form additional layers of quantum dots.

As previously described, the quantum dots may be embedded in quantum wells. The composition of the quantum well layer may be lattice matched to the substrate or strained up to the critical thickness for the generation of misfit dislocations. The as-grown islands may vary significantly in height. For quantum dots embedded in quantum wells, it is usually desirable that the islands be completely embedded in the quantum wells. Several techniques may be used to achieve this.

Figure 3A:
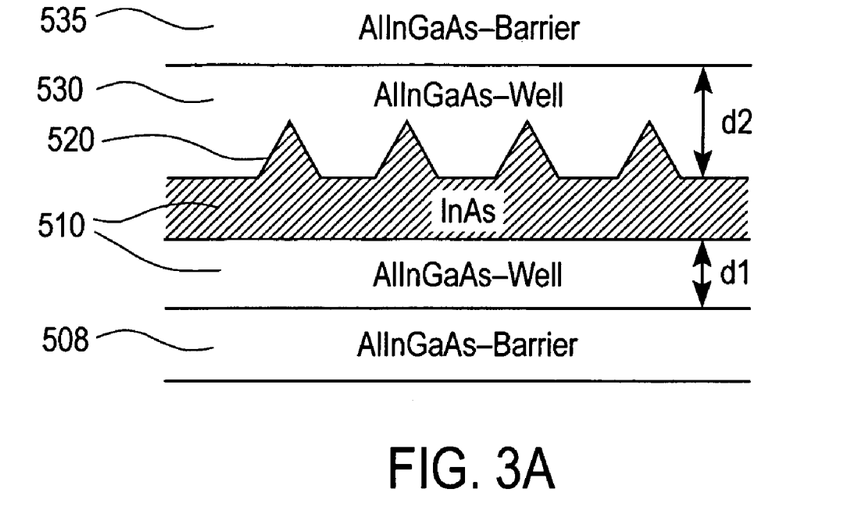
FIGS. 3A-3B are side views illustrating growth sequences for embedding quantum dots.

In the approach of FIG. 3A, the quantum dots 520 are embedded between a lower quantum well layer 510 having a thickness of d1 and an upper quantum well layer 530 having a thickness of d2, with d2>d1. In the example of FIG. 3A, the quantum well layers 510, 530 are located between barrier layers 508, 535 that have a bandgap energy larger than that of the quantum well layers. The upper quantum well layer 530 is thick enough so that it covers all of the quantum dots 520. Thus, the quantum dots 520 are embedded in the quantum well 510, 530 despite variances in the height of the quantum dots.

Figure 3B:
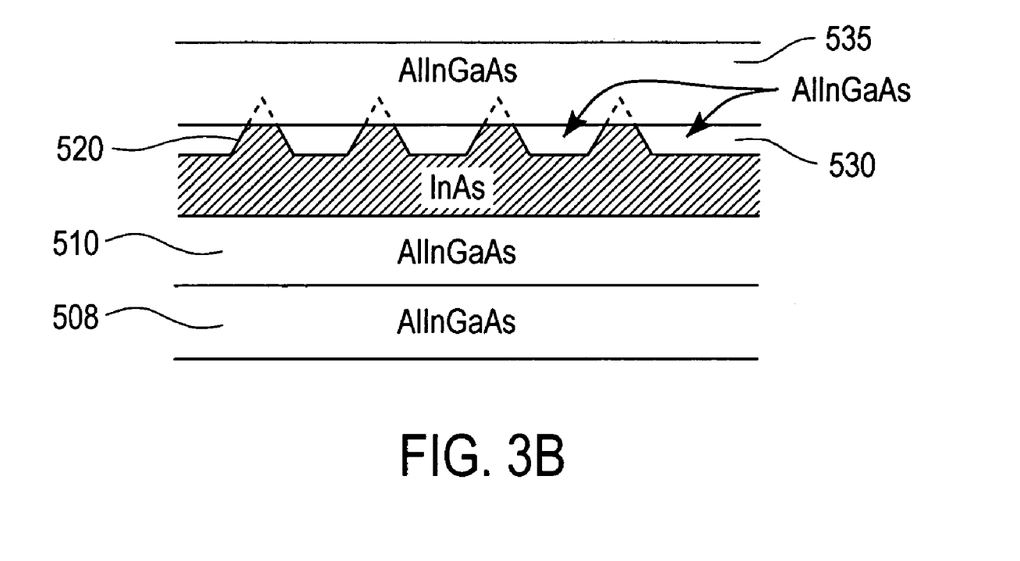

In FIG. 3B, growth parameters are adjusted to trim the quantum dots. In this case, quantum dots 520 are grown and a top quantum well layer 530 is grown. The thickness of the top quantum well layer 530 may be selected to be less than the height of the as-grown InAs islands 520. A thermal desorption (evaporation) step is performed after the growth of quantum well layer 530 to remove any uncovered portions of the InAs dots 520, as indicated in phantom. Thus, the peaks of the quantum dots 520 are trimmed and the quantum dots are embedded in the quantum well 510, 530.

Figure 4:
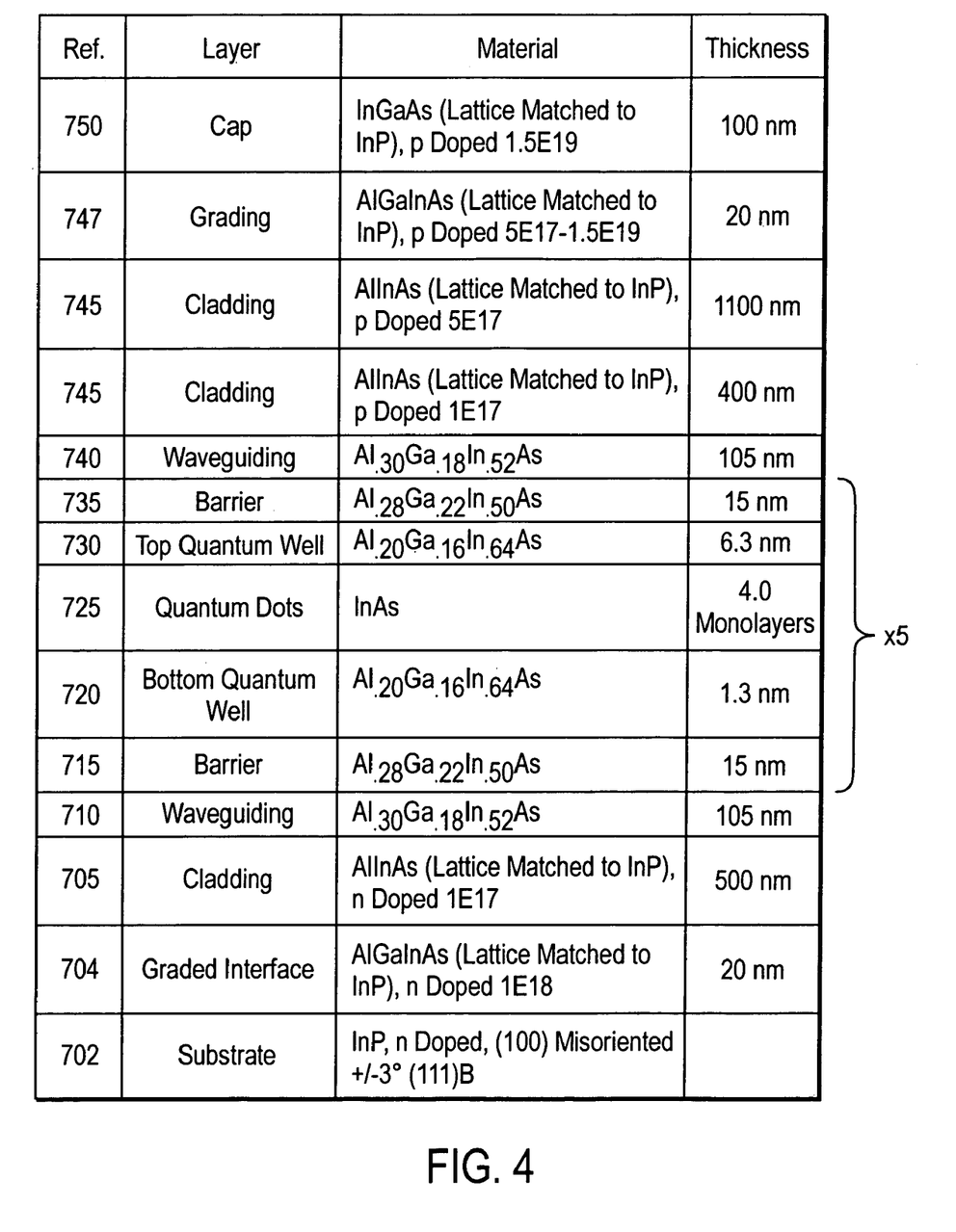
FIG. 4 is a side view illustrating an example growth sequence for a quantum dot laser.
Figure 5:
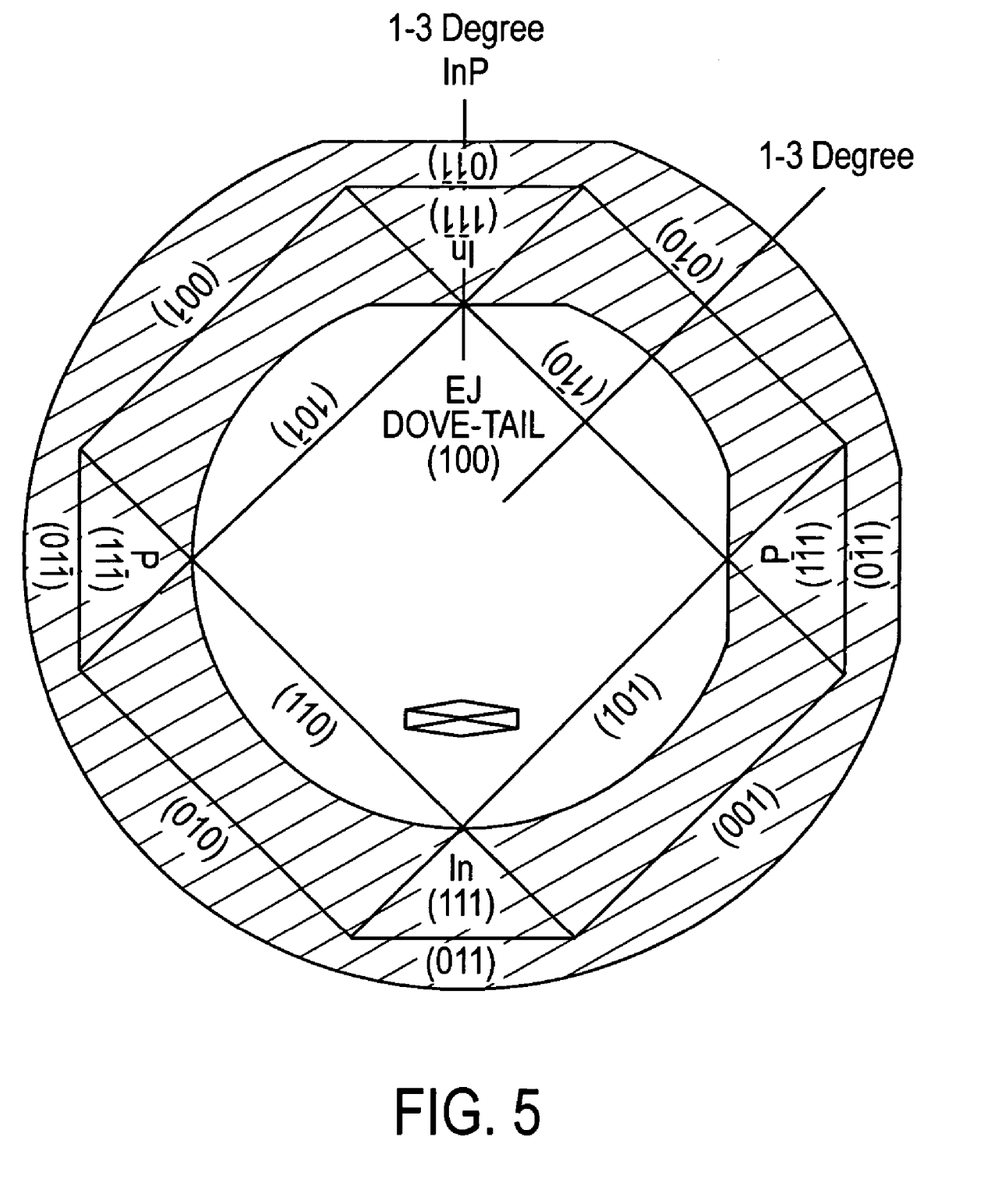
FIG. 5 shows crystallographic planes for a slightly off-axis (100) InP substrate.

FIG. 4 shows the layer structure for one example of a quantum dot laser. A preferred fabrication technique for this structure is MBE, although other techniques may be used as well. This structure is fabricated as follows. The substrate 702 is a slightly off-axis n-type InP substrate. In particular, InP single crystal misoriented (100) substrates ranging from 1-5 degrees toward the (111)B or (110) plane are preferred. Crystallographic planes for the misoriented (100) substrate are shown in FIG. 5. The InP substrate is preferably cleaned in ultra-high vacuum prior to growth, by heating the substrate to 545° C. under an $8 \times 10^{-6}$ $As_2$ millibar (mbar) beam equivalent pressure (BEP).

An n-type AlInAs optical cladding layer 705 is grown that is closely lattice matched to the InP substrate 702. In one embodiment, a graded interface layer 704 is included between substrate 702 and layer 705 to reduce electrical resistance. An AlGaInAs waveguiding layer 710 having an energy bandgap of 1.03 eV is then grown. The AlGaInAs waveguiding layer 710 preferably has a thickness of between about 100 nm to 500 nm.

An AlGaInAs quantum well barrier layer 715 is then grown having a composition corresponding to a bandgap energy of 1.03 eV. In one embodiment, the barrier layer is an $Al_{0.28}Ga_{0.22}In_{0.50}As$ layer having a thickness of about 15 nm. A bottom quantum well layer 720 is then grown. In one embodiment, this quantum well layer includes a 1.3 nm layer of $Al_{0.20}Ga_{0.16}In_{0.64}As$ having a semiconductor bandgap energy of 0.95 eV.

A preselected nominal InAs layer thickness 725 is then grown having a sufficient number of monolayers (four in this example) of InAs to form islands. In one embodiment, the substrate temperature is between 490 and 510 degrees Celsius as measured by a pyrometer and the As overpressure is two to five times that of the In. These growth parameters appear to result in an intermediate transition between a 2×4 (i.e., As rich) and a 4×2 (i.e., metal rich) reconstruction, thus yielding more symmetric quantum dots. The resulting arsenic-rich 2×1 quantum dots are typically 2 to 5 nm high and 15 to 25 nm in length and width. The dot density is in the range of 2-5E10/sq cm. An increased growth temperature tends to result in a more uniform distribution of dot sizes. Conversely, an increase in growth rate tends to reduce the uniformity of the dot size.

A top quantum well layer 730 is then grown to embed the islands. In one embodiment, the second quantum well layer is a 6.3 nm layer of $Al_{0.20}Ga_{0.16}In_{0.64}As$ having a semiconductor bandgap energy of 0.95 eV. More generally, quantum well layers 720, 730 with 18-22% Al and 14-18% Ga are generally preferred. Another barrier layer 735 is then grown. In one embodiment, this barrier layer is 15 nm of $Al_{0.28}Ga_{0.22}In_{0.50}As$. Multiple layers of embedded quantum dots may be formed by repeating the growth sequence of layers 715, 720, 725, 730 735. In this example, the sequence of layers 715, 720, 725, 730, and 735 is repeated five times.

A second waveguiding layer 740, such as an $Al_{0.30}Ga_{0.18}In_{0.52}As$ layer may then be grown. A p-type optical cladding layer 745 of AlInAs is then grown. A highly p-doped cap layer 750 may then be grown to facilitate forming high quality ohmic contacts to diode laser structure. A grading composition p-type layer 747 may be included to further reduce contact resistance.

The refractive indices of the optical cladding layers 705 and 745 and the waveguiding layers 710 and 740 are preferably selected to achieve significant optical confinement in cavity lasers formed from the material. Empirical and theoretical techniques to select optical cladding and waveguiding compositions and thicknesses are well known in the art.

Figure 6A:
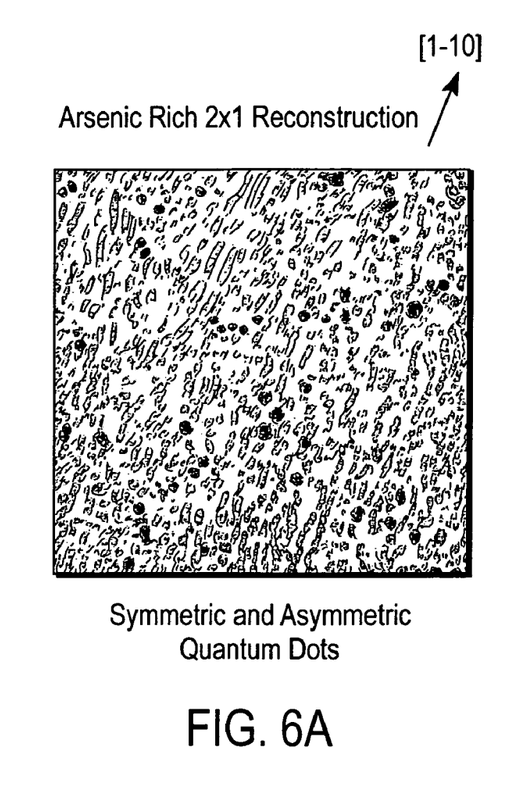
FIGS. 6A-6B are atomic force micrographs showing the spatial dependence with arsenic pressure for an on-axis (100) InP substrate.
Figure 6B:
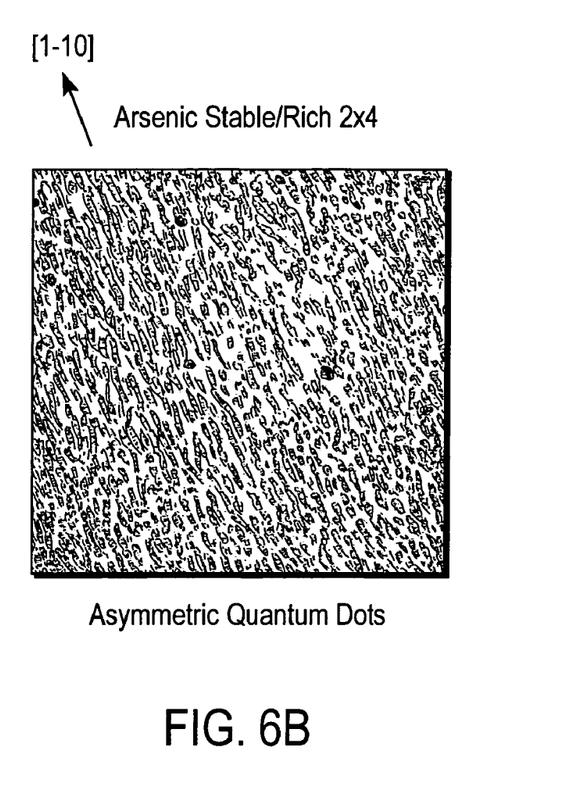

Returning to the quantum dot layer, note that the surface reconstruction of lattice matched $Ga_{0.5}In_{0.5}As$ under As-stable conditions is a highly anisotropic 2×4 reconstruction. Under these growth conditions, the resulting InAs quantum dots are highly elongated, as shown in FIG. 6A. Increasing the arsenic overpressure beyond the arsenic stable anisotropic 2×4 reconstruction to a more symmetric 2×1 surface reconstruction increases the symmetry of the InAs dot shape. This typically requires an As overpressure of greater than $6 \times 10^{-6}$ mbar. Atomic force micrographs showing the spatial dependence with arsenic pressure on (100) InP are shown in FIGS. 6A-6B.

Figure 7:
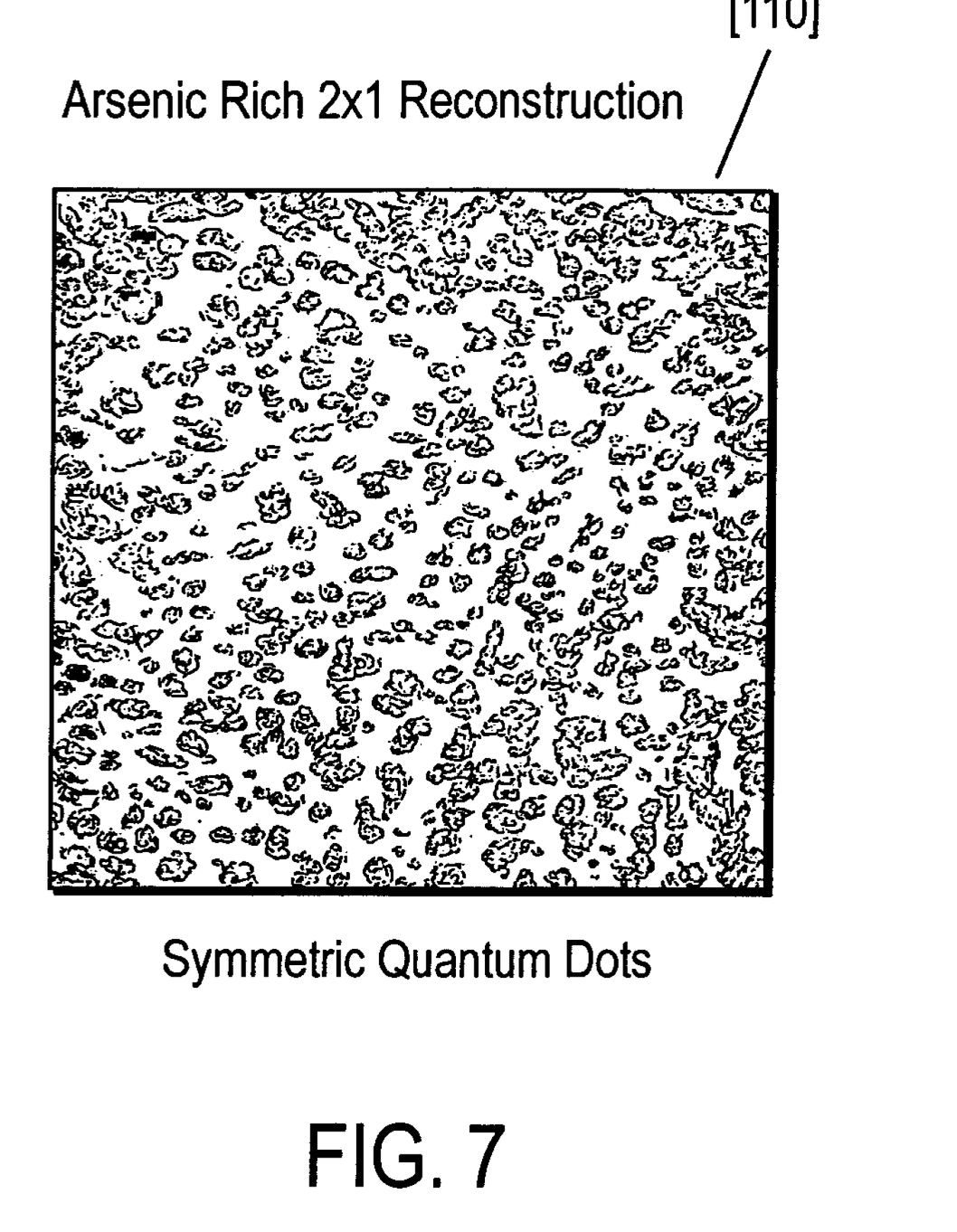
FIG. 7 is an atomic force micrograph of arsenic rich InAs for a slightly off-axis InP substrate.

FIG. 7 is an atomic force micrograph of the arsenic rich InAs on greater than (100) 2 degree towards (111)B on InP substrate. The sheet density is greater than 5E10/cm^2.

The growth techniques and resulting quantum dot structures described above have significant advantages. For example, the resulting quantum dot structure results in a significantly higher density of quantum dots compared to conventional processing of on-axis (100) InP substrates. The use of slightly off-axis (100) substrates, as compared to high index InP substrates (e.g., highly off-axis substrates such as (311) substrates), also avoids difficult materials problem from the standpoint of processing laser facets. For example, the use of slightly off-axis (100) substrates can avoid the high threshold currents from large mirror losses that can be present in lasers based on highly off-axis (311) substrates. Additionally, high index substrates energetically promote misfit dislocations in the InAs layer.

The growth techniques described above are not limited to the specific structures or materials systems shown. For example, the techniques generally work well with low strain systems (e.g., in the range of 3-7% strain) and, just as importantly, many other fabrication techniques do not work well with these low strain systems. Therefore, these growth techniques may be applied to other materials systems with similar strains. Examples of such systems include those based on Sb or Te. Thus, similar techniques may be used to form InSb quantum dots on GaSb substrates, for example.

The different growth techniques may also be used separately, rather than always in combination. For example, slightly off-axis substrates can be used without Group V overpressure and vice versa.

The quantum dot structures were described above in the context of a semiconductor laser. They can be used in the active regions of a variety of optoelectronic devices, such as optical amplifiers, discrete lasers, tunable lasers, and monolithic arrays of lasers. Quantum dots can be included in the active region of a p-i-n laser diode structure that includes an optical waveguide structure to provide optical confinement. Quantum dots can also be used in other applications as well (e.g., electronics). The quantum dot growth techniques described above can be used to fabricate quantum dots for a wide-range of devices and based on quantum dots of various shapes, sizes and dot densities. In a preferred embodiment, the quantum dots are self-assembled quantum dots with a length-to-width ratio of no more than three.

As examples of some devices where quantum dots can be used, referring to U.S. Pat. No. 6,600,169, "Quantum Dash Devices," filed Sep. 20, 2001 and issued on Jul. 29, 2003, the quantum dot regions described above can be used as the active layer in the ridge laser of FIG. 9, the tunable external cavity lasers of FIGS. 15-16, the DFB/DBR lasers of FIGS. 17-18, the multi-wavelength laser arrays of FIG. 19, the VCSEL of FIG. 20 and/or the transistors of FIGS. 20-21. Further examples and descriptions of laser structures are given in U.S. patent application Ser. No. 09/972,303, "Quantum Dot Lasers," filed Oct. 5, 2001, and U.S. patent application Ser. No. 10/087,408, "Quantum Dot Vertical Cavity Surface Emitting Laser," filed Mar. 1, 2002. All of the foregoing are incorporated by reference herein.

Figure 8:
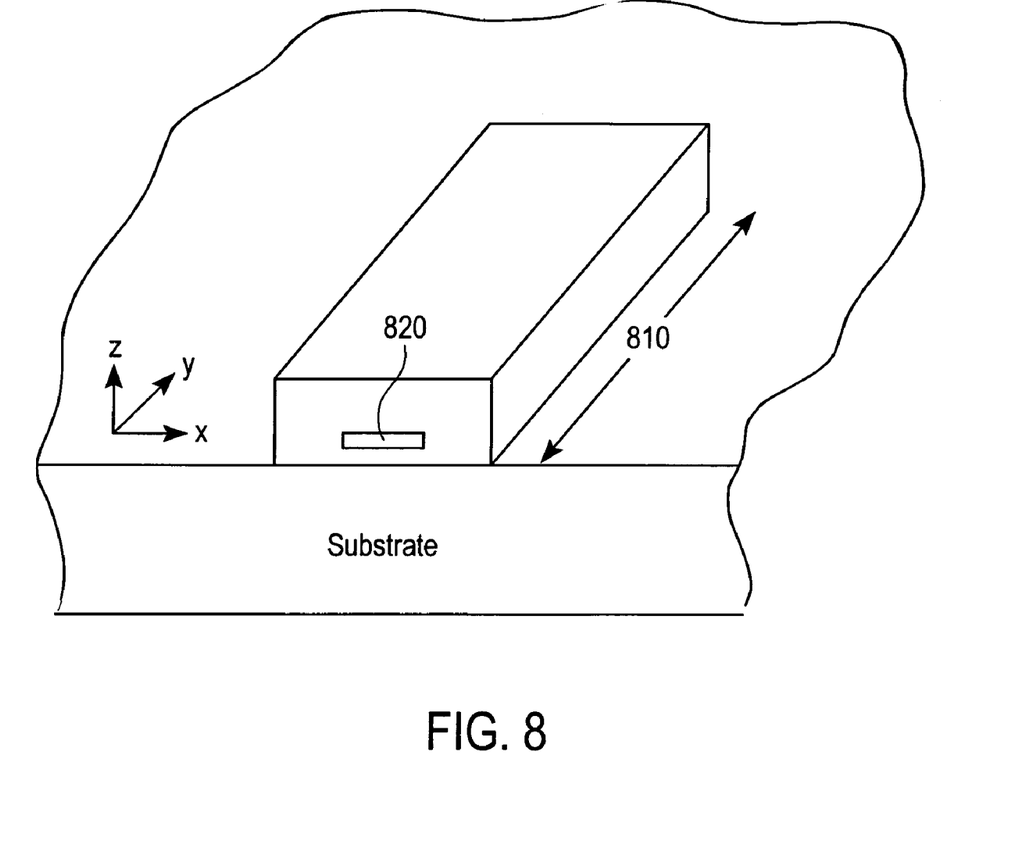
FIG. 8 is a perspective view of a semiconductor laser with a quantum dot active region.

As a specific example, consider the semiconductor laser shown in FIG. 8. This laser has a lateral laser cavity 810 (as opposed to a vertical laser cavity as can be found in VCSELs). The lateral laser cavity 810 is oriented in the plane of the substrate (i.e., primarily in the x-y plane). Edge emitting lasers, including those based on cleaved facets, and DFB and DBR lasers are some examples of semiconductor lasers that have lateral laser cavities. In FIG. 8, the laser cavity is shown in cross section. A quantum dot structure 820, such as those described above, provides optical gain for the laser cavity.

If the quantum dots in structure 820 exhibit some asymmetry (e.g., they are elongated in one direction), then the laser cavity 810 preferably is oriented so that the electric field of a TE polarized wave in the laser cavity is aligned with the elongated direction of the quantum dots. For example, for a nominal (100) InP substrate that is tilted 2 degrees towards the (110) direction, the lateral laser cavity 810 preferably is aligned with the (011) direction of the substrate. For a nominal (100) InP substrate that is tilted 3 degrees towards the (111)B direction, the lateral laser cavity 810 preferably is aligned with the (011) direction of the substrate. Even if perfectly symmetric quantum dots are expected, it can be advantageous to orient the laser cavity in these directions just in case some unexpected asymmetry appears. Orienting the lateral laser cavity in this manner typically results in lower threshold current, higher optical gain and/or better temperature performance.

What is claimed is:

1. A semiconductor active region for providing gain comprising:
   a quantum well formed on a slightly off-axis InP substrate with a crystallographic orientation of nominally (100); and
   a plurality of quantum dots embedded in the quantum well, wherein each quantum dot has a length-to-width ratio and the plurality of quantum dots have a mean length-to-width ratio of less than three to one.

2. The semiconductor active region of claim 1 wherein:
   the quantum well is an AlGaInAs quantum well; and
   the quantum dots comprise InAs quantum dots having a thickness less than a thickness of the quantum well.

3. The semiconductor active region of claim 1 wherein the crystallographic orientation of (100) is misoriented toward one of the family of (110) directions.

4. The semiconductor active region of claim 1 wherein the crystallographic orientation of (100) is misoriented toward one of the family of (111) directions.

5. The semiconductor active region of claim 1 wherein the quantum dots have a size distribution and a sequence of quantum confined energy states selected to form a continuous optical gain spectrum.

6. The semiconductor active region of claim 1 wherein the quantum dots have a mean height of between 2 and 5 nm, a mean width of between 15 and 25 nm, a mean length of between 15 and 25 nm and a mean length-to-width ratio of between 1:1 and 3:1.

7. The semiconductor active region of claim 1 wherein the quantum dots have a relaxed lattice constant that is not more than 7% greater than the substrate.

8. A semiconductor laser comprising:
   an active region comprising:
   a quantum well formed on a slightly off-axis substrate; and
   a plurality of quantum dots embedded in the quantum well, wherein asymmetry in the quantum dots is characterized by an elongated direction; and
   a lateral laser cavity including the active region, wherein the lateral laser cavity is oriented so that an electric field of a TE polarized wave in the lateral laser cavity is aligned with the elongated direction.

9. The semiconductor laser of claim 8 wherein:
   the slightly off-axis substrate is a nominal (100) InP substrate that is tilted towards the (110) direction; and
   the lateral laser cavity is aligned with the (011) direction of the substrate.

10. The semiconductor laser of claim 8 wherein:
    the slightly off-axis substrate is a nominal (100) InP substrate that is tilted towards the (111)B direction; and
    the lateral laser cavity is aligned with the (011) direction of the substrate.

11. A semiconductor active region for providing gain comprising:
    a quantum well formed on a slightly off-axis substrate; and
    a plurality of quantum dots embedded in the quantum well, wherein each quantum dot has a length-to-width ratio and the plurality of quantum dots have a mean length-to-width ratio of less than three to one;
    wherein the quantum dots have a size distribution and a sequence of quantum confined energy states selected to form a continuous optical gain spectrum.

12. The semiconductor active region of claim 11 wherein the quantum dots have a mean height of between 2 and 5 nm, a mean width of between 15 and 25 nm, a mean length of between 15 and 25 nm and a mean length-to-width ratio of between 1:1 and 3:1.

13. The semiconductor active region of claim 11 wherein the quantum dots have a relaxed lattice constant that is not more than 7% greater than the substrate.

14. The semiconductor active region of claim 11 wherein:
    the slightly off-axis substrate is an InP substrate;
    the quantum well is an AlGaInAs quantum well; and
    the quantum dots comprise InAs quantum dots having a thickness less than a thickness of the quantum well.

15. The semiconductor active region of claim 11 wherein the slightly off-axis substrate is InP with a crystallographic orientation of (100) misoriented toward one of the family of (110) directions.

16. The semiconductor active region of claim 11 wherein the slightly off-axis substrate is InP with a crystallographic orientation of (100) misoriented toward one of the family of (111) directions.

* * * * *